United States Patent [19]

Suetsugu et al.

[11] Patent Number: 6,074,894
[45] Date of Patent: Jun. 13, 2000

[54] MOUNTING METHOD OF SEMICONDUCTOR DEVICE

[75] Inventors: Kenichiro Suetsugu, Nishinomiya; Atsushi Yamaguchi, Minoh, both of Japan

[73] Assignee: Matsushita Electric Industrial Co., Ltd., Osaka-fu, Japan

[21] Appl. No.: 08/919,036

[22] Filed: Aug. 27, 1997

[30] Foreign Application Priority Data

Sep. 2, 1996 [JP] Japan ................................. 8-232035

[51] Int. Cl.⁷ ........................ H01L 21/44; H01L 21/48; H01L 21/50
[52] U.S. Cl. ........................ 438/106; 438/127; 438/613
[58] Field of Search .................. 438/106, 127, 438/612, 613

[56] References Cited

U.S. PATENT DOCUMENTS

| | | |
|---|---|---|
| 4,400,870 | 8/1983 | Islam . |
| 5,355,283 | 10/1994 | Marrs et al. . |
| 5,393,697 | 2/1995 | Chang et al. ........................ 438/613 |
| 5,607,877 | 3/1997 | Matsuda et al. .................... 438/613 |
| 5,658,827 | 8/1997 | Aulicino et al . . |

Primary Examiner—Kevin M. Picardat
Assistant Examiner—D. M. Collins
Attorney, Agent, or Firm—Akin, Gump, Strauss, Hauer & Feld, L.L.P.

[57] ABSTRACT

A bump electrode made of an alloy of two or more kinds of metals is formed on an electrode pad portion of a semiconductor device by the laser ablation method and the bump electrode is reflow-soldered to electrically bond the bump electrode to a terminal electrode section on a circuit board. The semiconductor device and the terminal electrode section are encapsulated in resin by the laser ablation method.

8 Claims, 5 Drawing Sheets

MOUNTING METHOD OF SEMICONDUCTOR DEVICE

BACKGROUND OF THE INVENTION

The present invention relates to a method for connecting a semiconductor device to a terminal electrode portion on a circuit board to mount the semiconductor device, and more particularly, to a method for forming a bump by using the laser ablation method which is a processing method where an interatomic bond or an intermolecular bond is severed by excitation caused by the energy of a laser and the severed atoms and atomic groups or molecules and molecular groups are transported by the energy of the laser. Moreover, the present invention relates to a method for encapsulating the semiconductor device and the circuit board in resin by the laser ablation method.

In accordance with a conventional method for connecting a semiconductor device to a terminal electrode portion on a circuit board to mount the semiconductor device, as shown in the cross-sectional view of a principal portion in FIG. 5, first, bump electrodes 7 of an alloy such as solder are provided on electrode pad portions 6A of a semiconductor device 6. The bump electrodes 7 are electrically connected to terminal electrode portions 8 on a circuit board 9 through a conductive adhesive containing a conductive filler made of an alloy of two or more kinds of metals.

In order to reply to demand of miniaturization of the semiconductor device 6, it is necessary to reduce the bump electrodes 7 in size. However, according to the conventional mounting method of the semiconductor device 6, the lower limit of the diameter of the bump electrode 7 is approximately 80 $\mu$m, and it is difficult to further reduce the diameter.

In addition, when the conductive adhesive containing the conductive filler made of an alloy of two or more kinds of metals is used for electrically connecting the bump electrodes 7 to the terminal electrode portions 8 on the circuit board 9, it takes two or more hours to set the adhesive, which renders this method disadvantageous in processing speed.

In another method, the bump electrodes 7 is soldered to the terminal electrode portions 8 of the circuit board 9 by the reflow soldering process. This process can be made quickly. The circuit board 9 having the semiconductor device 6 is encapsulated by epoxy sealant in the next step, and a resin-encapsulated portion is formed. However this process takes two to four hours to set the epoxy sealant. Since such a long time is necessary, a great difference in cycle time occurs in the production line, and therefore this method cannot be matched the mounting method according to SMT (surface mount technology).

An object of the present invention is to solve the above-mentioned problems associated with the mounting of a semiconductor device on a circuit board, not by the method using an adhesive or an epoxy sealant but by the laser ablation method.

BRIEF SUMMARY OF THE INVENTION

In accordance with a method of the present invention for mounting a semiconductor device on a circuit board, a bump electrode of an alloy of two or more kinds of metals is formed on an electrode pad portion of the semiconductor device by the laser ablation method. Then, the bump electrode is electrically connected to a terminal electrode portion on the circuit board through the reflow soldering process. Lastly, the semiconductor device and the terminal electrode portion are encapsulated in resin by the laser ablation method. The laser ablation method is a processing method where the interatomic bond or the intermolecular bond of a substance is severed by the energy of a laser and the severed atoms and atomic groups or molecules and molecule groups are transported to an object by the energy of the laser.

The bump electrode is made of an alloy including one of groups of two kinds of metals such as Sn and In, Sn and Bi and Sn and Ag as the base material. As the resin for encapsulation, polyethylene, polypropylene, polyamide or polycarbonate, etc. is usable. The reflow soldering process is performed in the air or an inert gas such as nitrogen or in a reducing gas such as hydrogen.

According to the present invention, by the above-described laser ablation method, a bump electrode of an alloy of two or more kinds of metals is formed on an electrode pad portion of a semiconductor device, and the semiconductor device and a circuit board where the bump electrode is electrically bonded to a terminal electrode portion on the circuit board are encapsulated in resin.

DETAILED DESCRIPTION OF THE INVENTION

Hereinafter, a mounting method of a semiconductor device according to an embodiment of the present invention will be described with reference to FIG. 1 to FIG. 4.

Figure 1:
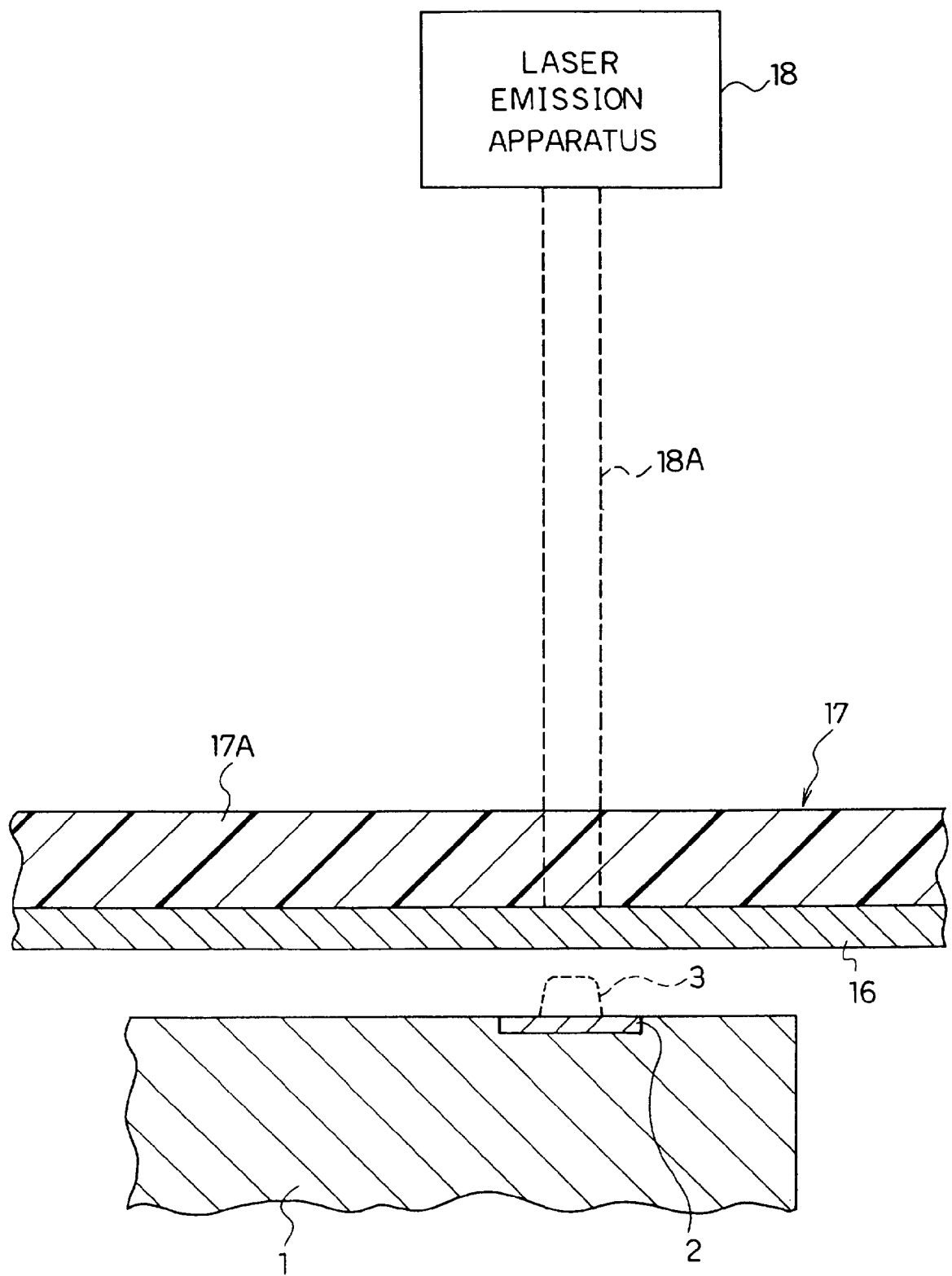
FIG. 1 is a side view showing an apparatus for forming a bump electrode by the laser ablation method in an embodiment of the present invention.

FIG. 1 is a side view showing an apparatus for performing a step of forming a bump electrode 3 of the semiconductor device in the embodiment of the present invention. In FIG. 1, a material sheet 17 in which a layer 16 of an alloy of two or more kinds of metals is provided on one surface of a substrate 17A with light transmitting property such as a glass plate or a Teflon (trademark) (polytetrafluoroethylene) film is disposed opposite to an electrode pad portion 2 of a semiconductor device 1. The material sheet 17 is disposed so that the surface having the alloy layer 16 is opposed to the electrode pad portion 2. The alloy layer 16 has been preliminarily formed by evaporation or plating and has a thickness of, for example, 10 to 30 $\mu$m. The distance between the alloy layer 16 and the electrode pad portion 2 is 15 to 40 $\mu$m.

A laser emission apparatus 18 for performing laser ablation is, for example, an excimer laser apparatus, and has an output of approximately 0.15 w. The laser emission apparatus 18 is disposed at a predetermined distance away from the material sheet 17 and irradiates the substrate 17A of the material sheet 17 not having the alloy layer 16 with a laser beam 18A having a spot size of 10 to 50 μm in the atmosphere. The irradiation time is, for example, 0.1 second. By the irradiation with the laser beam 18A, the alloy layer 16 is ablated and adheres to the electrode pad portion 2, so that the bump electrode 3 shown by the dotted line is formed.

Figure 2:
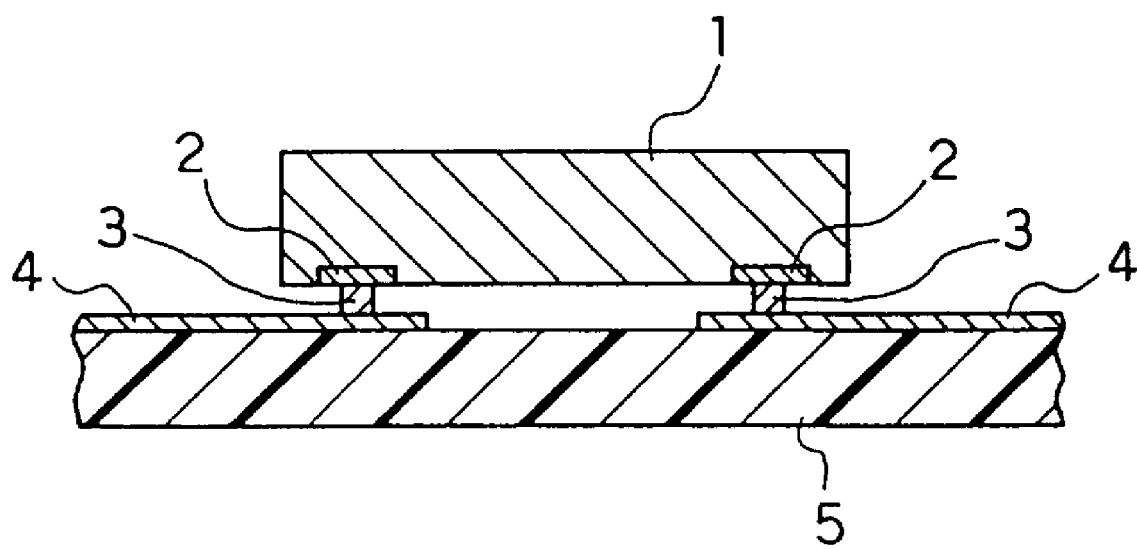
FIG. 2 is a side cross-sectional view showing a condition in which the bump electrodes formed by the laser ablation method are connected to terminal electrode portions on a circuit board.

FIG. 2 is a cross-sectional view showing a condition in which bump electrodes 3 formed by the above-described laser ablation method are connected to terminal electrode portions 4 of a circuit board 5 through a step described later.

As the above-mentioned alloy, such alloys containing two kinds of metals are desirable. In the embodiment the following alloys are used: alloys of Sn and In (48 wt % Sn; 52 wt % In), alloy of Sn and Bi (42 wt % Sn; 58 wt % Bi) and alloy of Sn and Ag (96.5 wt % Sn; 3.5 wt % Ag). Besides, alloys containing three or more kinds of metals are usable. In the embodiment preferable examples of the alloy include Sn—Ag—Bi alloy (90.5 wt % Sn; 3.5 wt % Ag; 6 wt % Bi) and Sn—Ag—Bi—In—Cu alloy (85.5 wt % Sn; 3 wt % Ag; 10.0 wt % Bi; 1.0 wt % In; 0.5 wt % Cu). These alloys are formed by evaporation or plating on one surface of the glass plate or the Teflon sheet so as to have a thickness of 10 to 30 μm, thereby producing the material sheet 17.

According to using an alloy containing two or more kinds of metals as the material of the bump electrode, the melting point is lowered. In addition, the strength of the bump electrode increases and the solder wettability improves. As a result, the reliability of the connection between the semiconductor device 1 and the circuit board 5 improves. Characteristics of the above-mentioned alloys are shown in Table 1.

TABLE 1

| Alloy | Melting point | Wettability | Strength | Reliability |
| --- | --- | --- | --- | --- |
| Sn—In | 118° C. | Good | Poor | Poor |
| Sn—Bi | 136° C. | Good | Poor | Poor |
| Sn—Ag | 221° C. | Poor | Good | Good |
| Sn—Ag—Bi | 216° C. | Good | Good | Good |
| Sn—Ag—Bi—In—Cu | 200° C. | Good | Good | Good |
| (Comparison example) Sn | 232° C. | Poor | Poor | Poor |

Compositions of the Sn—Ag—Bi alloy and the Sn—Ag—Bi—In—Cu alloy are not restricted to the values as described above. The alloys usable for the present embodiment are as follows: Sn—Ag—Bi alloy (83 to 92 wt % Sn; 2.5 to 4.0 wt % Ag; 5 to 18 wt % Bi) and Sn—Ag—Bi—In—Cu alloy (80 to 92 wt % Sn; 2.5 to 4.0 wt % Ag; 5 to 18 wt % Bi; 0.1 to 1.5 wt % In; 0.1 to 0.7 wt % Cu).

After flux is applied to the bump electrodes 3, the bump electrodes 3 are brought into contact with the terminal electrode portions 4 on the circuit board 5 and reflow-soldered in the atmosphere, in nitrogen or in a reducing gas. As a result, as shown in FIG. 2, the semiconductor device 1 is electrically connected to the circuit board 5.

Then, the semiconductor device 1 and the terminal electrode portions 4 are encapsulated in resin such as polyethylene, polypropylene, polyamide or polycarbonate, etc. by the laser ablation method.

Figure 3:
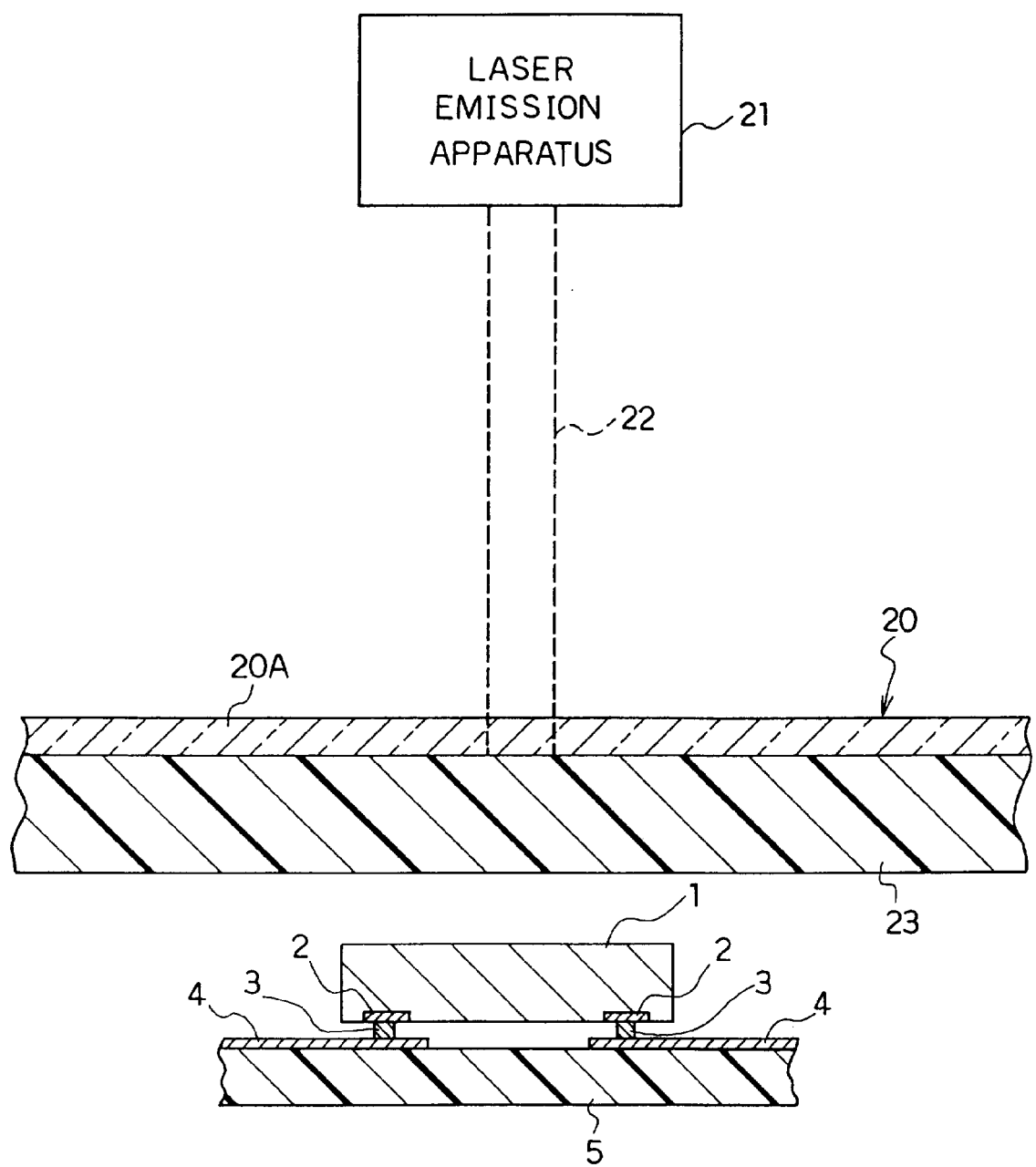
FIG. 3 is a side view showing an apparatus for performing resin encapsulation by the laser ablation method in the embodiment of the present invention.
Figure 4:
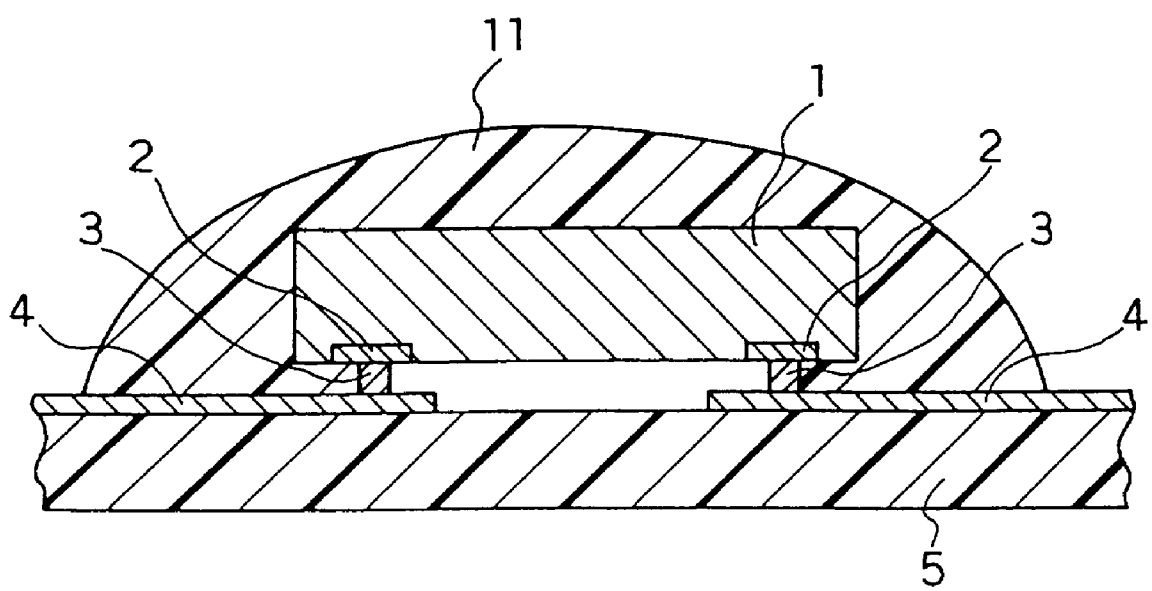
FIG. 4 is a side cross-sectional view showing a semiconductor device and a circuit board encapsulated in resin by the laser ablation method.
Figure 5:
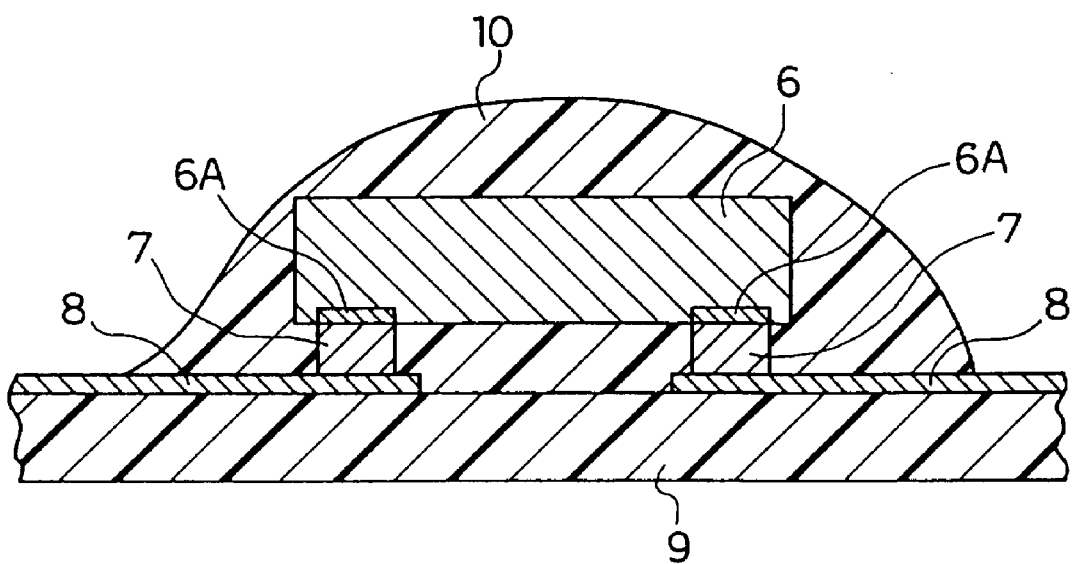
FIG. 5 is the side cross-sectional view showing the semiconductor device and the circuit board connected by bump electrodes formed according to the conventional method, and encapsulated in resin by the conventional method.

FIG. 3 is a side view showing an apparatus for performing a step of resin encapsulation by the laser ablation method. In FIG. 3, a resin film 20 made of at least one kind of the above-mentioned resins such as polyethylene, etc. is spaced by a distance of 0.5 - - - 1.0 mm from a surface of the semiconductor device 1 mounted on the circuit board 5 so as to be opposite to the surface. The resin film 20 is a film unit of a resin such as polyethylene, etc. with a thickness of 0.2 to 1 mm. Moreover, the resin film 20 may have a structure as shown in FIG. 3 such that a resin 23 such as polyethylene, etc. with a thickness of 0.5 to 1 mm is provided on a substrate 20A of glass or Teflon, etc. with a thickness of 0.05 to 0.2 mm having light transmitting capability and heat resistance.

The surface of the resin film 20 opposite to the surface opposed to the semiconductor device 1 is irradiated with a laser beam 22 from a laser emission apparatus 21 in the atmosphere. As a consequence, the portion of the resin film 20 irradiated with the laser beam 22 is ablated and adheres to the surfaces of the semiconductor device 1 and the circuit board 5 by the laser ablation. For the laser emission apparatus 21, for example, a YAG laser apparatus and an argon laser apparatus are suitable. The output of the laser beam is 10 to 20 w. The spot size of the laser beam is 0.5 to 1 mm. The irradiation time is 0.1 to 1 second. When the spot size of the laser beam 22 is smaller than the size of the surface of the semiconductor device 1, the surface of the resin film 20 is scanned by the laser beam 22 so as to resin-encapsulate a desired area of the circuit board 5. The circuit board 5 may be moved on the plane perpendicular to the laser beam 22 instead of scanning by the laser beam 22.

According to the present invention, since the bump electrode 3 is formed by the laser ablation method, the diameter of the bump electrode 3 depends on the spot size of the laser beam. By reducing the spot size of the laser beam, a bump electrode 3 is formed which has a correspondingly small diameter. In this embodiment, a bump electrode were formed which has a diameter of 10 μm or smaller. Since the diameter of the bump electrode 3 can be reduced, an area-bump may be formed in which a multiplicity of bump electrodes are uniformly spaced in a predetermined area of the semiconductor device.

Since the resin encapsulation is performed by ablating the resin by the laser ablation method, the time necessary for the resin encapsulation of one semiconductor device is approximately one minute. Thus, the time is greatly reduced compared with the conventionally required two to four hours.

Although the present invention has been described in terms of the presently preferred embodiments, it is to be understood that such disclosure is not to be interpreted as limiting. Various alterations and modifications will no doubt become apparent to those skilled in the art to which the present invention pertains, after having read the above disclosure. Accordingly, it is intended that the appended claims be interpreted as covering all alterations and modifications as fall within the true spirit and scope of the invention.

What is claimed is:

1. A mounting method of a semiconductor device comprising the steps of:
    forming a bump electrode of an alloy of at least two kinds of metals on an electrode pad portion of a semiconductor device by ablating said alloy and adhering said alloy to said electrode pad by a laser ablation method;
    soldering said bump electrode to electrically bond said bump electrode to a terminal electrode portion on a circuit board; and
    encapsulating said semiconductor device and said terminal electrode portion on said circuit board with a resin by ablating said resin and adhering said resin to the surfaces of said semiconductor device and said terminal electrode portion by the laser ablation method.

2. A mounting method of a semiconductor device comprising the steps of:

disposing a substrate with a light transmitting property having on one surface an alloy layer containing at least two kinds of metal materials so that said alloy layer is opposed to an electrode pad portion of a semiconductor device;

irradiating an area of said substrate opposed to said electrode pad portion with a laser beam from the other surface of said substrate thereby forming a bump electrode of the metal materials of said alloy layer by ablating at least a portion of said alloy layer and adhering said at least a portion of said alloy layer to said electrode pad portion by a laser ablation method;

soldering said bump electrode to a terminal electrode portion of a circuit board;

disposing a resin film so that one surface thereof is opposed to a surface of said circuit board where said semiconductor device is soldered; and welding said resin film so as to apply at least a portion of said resin film onto the surface of said circuit board, including said semiconductor device by emitting a laser beam onto the other surface of said resin film.

3. A mounting method of a semiconductor device in accordance with claim 1, wherein said alloy of at least two kinds of metals is an alloy made of two metals selected from among groups of Sn and In, Sn and Bi, and Sn and Ag as a base, said alloy being an alloy selected from between Sn—Ag—Bi alloy (83 to 92 wt % Sn; 2.5 to 4.0 wt % Ag; 5 to 18 wt % Bi) and Sn—Ag—Bi—In—Cu alloy (80 to 92 wt % Sn; 2.5 to 4.0 wt % Ag; 5 to 18 wt % Bi; 0.1 to 1.5 wt % In; 0.1 to 0.7 wt % Cu).

4. A mounting method of a semiconductor device in accordance with claim 2, wherein said alloy of at least two kinds of metals is an alloy made of two metals selected from among groups of Sn and In, Sn and Bi, and Sn and Ag as a base, said alloy being an alloy selected from between Sn—Ag—Bi alloy (83 to 92 wt % Sn; 2.5 to 4.0 wt % Ag; 5 to 18 wt % Bi) and Sn—Ag—Bi—In—Cu alloy (80 to 92 wt % Sn; 2.5 to 4.0 wt % Ag; 5 to 18 wt % Bi; 0.1 to 1.5 wt % In; 0.1 to 0.7 wt % Cu).

5. A mounting method of a semiconductor device in accordance with claim 1, wherein said resin is a resin selected from the groups consisting of polyethylene, polypropylene, polyamide and polycarbonate.

6. A mounting method of a semiconductor device in accordance with claim 2, wherein said resin is a resin selected from the groups consisting of polyethylene, polypropylene, polyamide and polycarbonate.

7. A mounting method of a semiconductor device in accordance with claim 1, wherein said soldering step is a reflow soldering process performed in the atmosphere, in an inert gas such as nitrogen, or in a reducing gas such as hydrogen.

8. A mounting method of a semiconductor device in accordance with claim 2, wherein said soldering step is a reflow soldering process performed in the atmosphere, in an inert gas such as nitrogen, or in a reducing gas such as hydrogen.

* * * * *